(12) United States Patent
Koenig et al.

(10) Patent No.: US 10,978,507 B2
(45) Date of Patent: Apr. 13, 2021

(54) METHOD FOR MANUFACTURING OPTICAL SENSOR ARRANGEMENTS AND HOUSING FOR AN OPTICAL SENSOR

(71) Applicant: ams AG, Premstaetten (AT)

(72) Inventors: Sonja Koenig, Graz (AT); Bernhard Stering, Stainz (AT); Harald Etschmaier, Graz (AT)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 16/346,273

(22) PCT Filed: Oct. 19, 2017

(86) PCT No.: PCT/EP2017/076759
§ 371 (c)(1),
(2) Date: Apr. 30, 2019

(87) PCT Pub. No.: WO2018/082934
PCT Pub. Date: May 11, 2018

(65) Prior Publication Data
US 2019/0267424 A1    Aug. 29, 2019

(30) Foreign Application Priority Data
Nov. 3, 2016 (EP) .................................... 16197039

(51) Int. Cl.
*H01L 27/146* (2006.01)

(52) U.S. Cl.
CPC .. *H01L 27/14685* (2013.01); *H01L 27/14618* (2013.01); *H01L 27/14623* (2013.01); *H01L 27/14683* (2013.01); *H01L 27/14636* (2013.01)

(58) Field of Classification Search
CPC .............................. H01L 27/146; H01L 27/148
See application file for complete search history.

(56) References Cited

U.S. PATENT DOCUMENTS 6,371,045 B1 * 4/2002 Wang .................... C23C 14/046
                                                             118/723 E
2006/0043512 A1    3/2006 Oliver et al.
(Continued)

FOREIGN PATENT DOCUMENTS

| CN | 102460699  | 5/2012  |
| EP | 2 261 977  | 12/2010 |
| WO | 2015/111419 | 7/2015  |

OTHER PUBLICATIONS

European Patent Office, International Search Report for PCT/EP2017/076759 dated Jan. 17, 2018.

*Primary Examiner* — Marcos D. Pizarro
*Assistant Examiner* — Sue Tang
(74) *Attorney, Agent, or Firm* — MH2 Technology Law Group LLP

(57) ABSTRACT

A method for manufacturing optical sensor arrangements is provided. The method comprises providing at least two optical sensors on a carrier and providing a cover material on the side of the optical sensors facing away from the carrier. The method further comprises providing an aperture for each optical sensor on a top side of the cover material facing away from the carrier and forming at least one trench between the optical sensors from the carrier towards the top side of the cover material, the trench comprising inner walls. Moreover, the method comprises coating the inner walls with an opaque material, such that an inner volume of the trench is free of the opaque material, and singulating of the optical sensor arrangements along the at least one trench. Furthermore, a housing for an optical sensor is provided.

8 Claims, 4 Drawing Sheets

(56) References Cited

U.S. PATENT DOCUMENTS

| | | |
|---|---|---|
| 2007/0052827 A1 | 3/2007 | Hiltunen |
| 2010/0129954 A1 | 5/2010 | Kong |
| 2012/0146170 A1* | 6/2012 | Vigier-Blanc .... H01L 27/14683 257/432 |
| 2014/0264691 A1 | 9/2014 | Oganesian et al. |

* cited by examiner

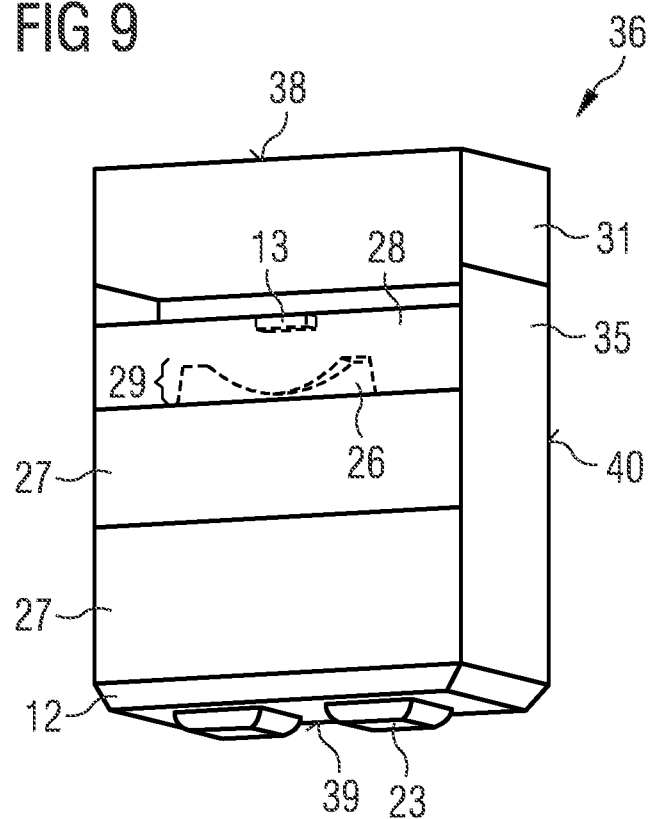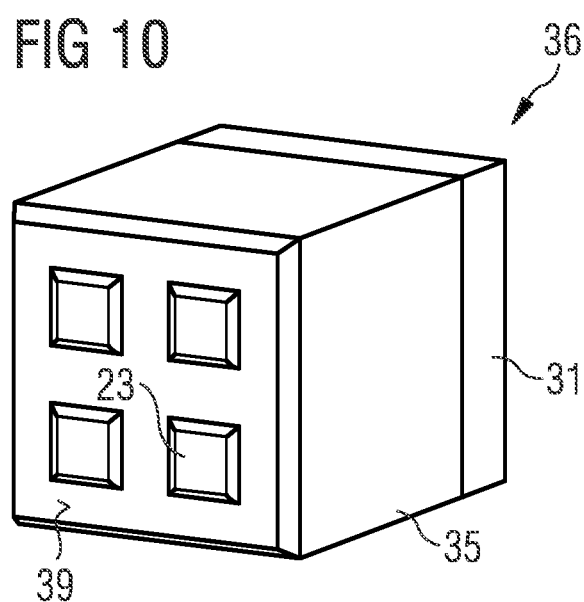

ically using the bottom surface of the carrier. In particular, for a miniaturization of the optical sensor arrangements, a Wafer Level Packaging is advantageously performed.

METHOD FOR MANUFACTURING OPTICAL SENSOR ARRANGEMENTS AND HOUSING FOR AN OPTICAL SENSOR

The present application relates to a method for manufacturing optical sensor arrangements and a housing for an optical sensor.

BACKGROUND OF THE INVENTION

Optical sensors are widely employed in many different fields such as digital still cameras, cellular phones, security cameras, medical equipment, automobiles and other applications. Especially for small devices complementary metal oxide semiconductor structures and charged coupled devices are of great importance. In particular for these devices, a further miniaturization and a lower power consumption are desired.

For many optical sensor devices it is required that light can enter the device only through an aperture. Therefore, an opaque coating or a housing is required for the optical sensor device. One possible solution is to coat the housing of an optical sensor device with thick coating layers as walls, for example with a mold compound. However, in this case, the production process is complicated and the size and the weight of the optical sensor device is increased.

SUMMARY OF THE INVENTION

The present disclosure provides a method for manufacturing optical sensor arrangements which enables a cheap and efficient production of the optical sensor arrangements. The disclosure further provides a housing for an optical sensor which can be produced in a cheap and efficient way.

According to at least one embodiment of the method for manufacturing an optical sensor arrangement the method comprises the step of providing at least two optical sensors on a carrier. The optical sensors can be, for example, charge coupled devices, complementary metal oxide semiconductor devices, photo diodes, ultra-violet sensors or pyro-electrical sensors. The term "optical" refers to the range of visible, ultraviolet and infrared light. It is also possible that one optical sensor arrangement comprises a plurality of optical sensors. The optical sensors can be grown or manufactured on the carrier and they are arranged next to each other on the carrier. Each optical sensor can comprise at least one electrical contact such that the optical sensors can be contacted and that they are electrically isolated from each other. The carrier can be a wafer and it can comprise, for example, glass.

The method for manufacturing optical sensor arrangements further comprises the step of providing a cover material on the side of the optical sensors facing away from the carrier. The cover material can cover the optical sensors over the whole lateral extension of the carrier. Advantageously, the cover material comprises a transparent material such that light can pass through the cover material and be detected by the optical sensors. It is possible to arrange optical elements as, for example, a lens within the cover material. The cover material can be formed with glass, silicon, polymers or Plexiglas.

The method for manufacturing optical sensor arrangements further comprises the step of providing an aperture for each optical sensor on a top side of the cover material facing away from the carrier. The apertures can be formed by providing an opaque aperture layer such as a metal on the top side of the cover material where at least one aperture is formed for each optical sensor. This means, the aperture layer comprises holes above the optical sensors that form the apertures. The apertures can be positioned above the optical sensors such that light, which direction of incidence is perpendicular to the main plane of extension of the carrier, can be detected by the optical sensors.

The method for manufacturing optical sensor arrangements further comprises the step of forming at least one trench between the optical sensors from the carrier towards the top side of the cover material with the trench comprising inner walls. The trench can be formed by cutting the carrier and the cover material from the side of the carrier towards the top side of the cover material. This means all layers and materials from the carrier towards the top side of the cover material are cut in order to form the trench. After the cutting, the trench comprises a thickness which is given by the diameter or lateral extent of the trench. Therefore, the trench comprises inner walls which are approximately perpendicular to the main plane of extension of the carrier. If several optical sensors are arranged next to each other on the carrier, trenches can be formed between all optical sensors.

The method for manufacturing optical sensor arrangements further comprises the step of coating the inner walls with an opaque material such that an inner volume of the trench is free of the opaque material. This means a coating is formed on the inner walls of the trench. It is possible that also a bottom surface of the trench, which is in the plane of the apertures, is coated with the opaque material. Advantageously, the coating covers the inner walls and the bottom surface of the trench completely such that the inner walls and the bottom surface are opaque for light and electromagnetic radiation which is to be detected by the optical sensors.

The coating can be formed by spray coating or physical vapor deposition. Advantageously, the opaque material sticks to glass or silicon and comprises a thickness of less than 100 μm. The thickness of the opaque material is measured in a direction which is perpendicular to the main plane of extension of the inner walls of the trench. The diameter of the trench or the lateral extension of the trench amounts to more than twice the thickness of the opaque material. Therefore, the trench is not completely filled with the opaque material but only the inner walls of the trench are coated with the opaque material. After the coating, the trench comprises an inner volume between the inner walls which is free of the opaque material.

The opaque material is opaque for light and electromagnetic radiation which his to be detected by the optical sensors. The optical density or absorbance of the opaque material can amount to 3 to 4.6 for a thickness of approximately 1 μm. It can be topographically flat when deposited onto the inner walls of the trenches and it can exhibit a good adhesion to glass and silicon.

The method for manufacturing optical sensor arrangements further comprises the step of singulating the optical sensor arrangements along the at least one trench. This means, in this step the optical sensor arrangements are fully singulated by cutting the optical sensor arrangements along the at least one trench.

Since the optical sensors are provided on the carrier, which can be a wafer, a plurality of optical sensor arrangements can be manufactured at the same time. Advantageously, a plurality of optical sensors is provided on the carrier. Since several thousands of optical sensor arrangements can be processed simultaneously, the optical sensor arrangements can be manufactured very efficiently and at reduced cost. Furthermore, it is more efficient to combine the coating of the optical sensor arrangements and the singulation of the optical sensor arrangements by forming the trenches between the optical sensors.

The coating of the inner walls of the trenches with the opaque material comprises the advantage over mold-supported compounds that the opaque material can be inorganic based and it can comprise a coefficient of thermal expansion which is similar to the coefficient of thermal expansion of the carrier. Therefore, thermally induced stress in the optical sensor arrangements is avoided and the adhesion of the opaque material to the glass wafer is higher. Furthermore, coatings created by spray coating or physical vapor deposition can be very thin in comparison to typical mold compounds such that the coating can be very thin and lightweight which is advantageous for applications in small devices. Moreover, the method for manufacturing optical sensor arrangements is compatible with standard industry equipment such as wafer saws, spray coating and physical vapor deposition tools. This enables an efficient and cheap production of optical sensor arrangements.

According to at least one embodiment of the method for manufacturing optical sensor arrangements, each optical sensor comprises at least one electrical contact and the electrical contacts are at least partially free of any isolating material before the singulation along the trench. The electrical contacts can be arranged at a bottom side of the carrier facing away from the optical sensors. That the electrical contacts are at least partially free of any isolating material means that the electrical contacts can be electrically contacted such that the optical sensor arrangements can be tested before the singulation along the trench. Since the inner walls are coated with the opaque material before the singulation, the optical sensor arrangements are fully functional before the singulation. This means the optical sensor arrangements can be tested on wafer level, which allows a more efficient and cheaper production of the optical sensor arrangements.

According to at least one embodiment of the method for manufacturing optical sensor arrangements, the electrical contacts are arranged at a bottom side of the carrier facing away from the aperture. The electrical contacts can be electrically connected with the optical sensors by through silicon vias through the carrier. The electrical contacts can comprise a solder bump.

According to at least one embodiment of the method for manufacturing optical sensor arrangements, the electrical contacts are protected by a first protecting film during the coating of the trench. This means the first protecting film can be applied to the bottom side of the carrier in order to protect the electrical contacts. The first protecting film can be glued to the bottom side of the carrier such that it can be removed after the coating of the trench.

According to at least one embodiment of the method for manufacturing optical sensor arrangements, the first protecting film is removed after the coating of the trench. This means the electrical contacts can be electrically contacted and the sensor arrangements can be tested after the coating.

According to at least one embodiment of the method for manufacturing optical sensor arrangements, the coating of the trench with the opaque material comprises spray coating or physical vapor deposition. The advantages of these coating methods are that the coating of the trenches can be very thin. Furthermore, the opaque material can be inorganic based and its coefficient of thermal expansion can be similar to the coefficient of thermal expansion of the carrier.

According to at least one embodiment of the method for manufacturing optical sensor arrangements, the trench comprises a bottom surface which is coated with the opaque material. The bottom surface can be in the plane of the apertures.

According to at least one embodiment of the method for manufacturing optical sensor arrangements, the thickness of the opaque material at the inner walls of the trench amounts to less than 100 µm. The thickness of the opaque material at the inner walls is measured in a direction which is perpendicular to the main plane of extension of the inner walls of the trenches. The diameter of the trench or the lateral extension of the trench amounts to more than twice the thickness of the opaque material. Therefore, the trench is not completely filled with the opaque material but only the inner walls of the trench are coated with the opaque material.

According to at least one embodiment of the method for manufacturing optical sensor arrangements, a lens is arranged between each optical sensor and the corresponding aperture. This means the lens can be formed within the cover material. It is also possible that other optical elements or filters are arranged between the optical sensor and the corresponding aperture. It is also possible that several optical elements are arranged between the optical sensor and the corresponding aperture.

According to at least one embodiment of the method for manufacturing optical sensor arrangements, the optical sensors each comprise a complementary metal oxide semiconductor image sensor. Advantageously, these image sensors can be small in size and their power consumption can be small.

Furthermore, a housing for an optical sensor is provided. The housing may be produced by means of one of the methods described herein. This means all features disclosed for the method for manufacturing optical sensor arrangements are also disclosed for the housing for an optical sensor and vice-versa.

In one embodiment of the housing for an optical sensor, the housing comprises an aperture in a top housing surface, at least one electrical contact and an opaque material forming a coating at the side surfaces of the housing where the side surfaces comprise all surfaces of the housing, except for the top housing surface and a bottom housing surface facing away from the top housing surface. Furthermore, the housing is arranged to accommodate an optical sensor and the electrical contact is free of the opaque material. The coating at the side surfaces of the housing is topographically flat.

The aperture in the top housing surface can be arranged above an optical sensor in the housing such that light incident perpendicular to the surface of the housing can be detected by the optical sensor. The electrical contact can be arranged at a bottom housing surface facing away from the top housing surface. The electrical contact can be electrically connected with the optical sensor in the housing. The coating can be formed by spray coating or physical vapor deposition such that a thin coating can be formed. Since the opaque material covers all the side surfaces of the housing, only light entering through the aperture can be detected by the optical sensor. The electrical contact can be free of the opaque material because it is protected by a first protecting film during the deposition of the opaque material.

That the coating is topographically flat means that no edges or no signs of cutting can be observed at the coating at the side surfaces. The housing for an optical sensor can be partially singulated before the deposition of the coating such that no signs of cutting or singulation can be observed at the coating at the side surfaces.

The coating comprises the advantage over mold-supported compounds that the opaque material can be inorganic based and it can comprise a coefficient of thermal expansion which is similar to the coefficient of thermal expansion of parts of the housing. Therefore, thermally induced stress in the housing is avoided. Furthermore, coatings created by spray coating or physical vapor deposition can be very thin in comparison to typical mold compounds such that the coating can be very thin and lightweight. Moreover, housings for optical sensors that are manufactured by the method described above can be produced in a cheap and efficient way.

In one embodiment of the housing for an optical sensor, the thickness of the coating amounts to less than 100 µm. The thickness of the coating is measured in a direction which is perpendicular to the side surfaces of the housing. In comparison to typical mold compounds the coating can be very thin and lightweight which is advantageous for applications in small devices.

In one embodiment of the housing for an optical sensor, the optical sensor comprises a complementary metal oxide semiconductor image sensor. Advantageously, these image sensors can be small in size and their power consumption can be small.

In one embodiment of the housing for an optical sensor, the housing is surface-mountable. This means the electrical contact can be arranged at the bottom side of the housing such that the optical sensor can be electrically contacted from the bottom side of the housing.

In one embodiment of the housing for an optical sensor, the housing comprises an optical sensor. The optical sensor can be a charge coupled device, a complementary metal oxide semiconductor device, a photo diode, an ultra-violet sensor or a pyro-electrical sensor. It is also possible that the optical sensor comprises a plurality of optical sensors.

With FIGS. 2 to 8, an exemplary embodiment of the method for manufacturing optical sensor arrangements is described.

In FIGS. 9 and 10 a housing for an optical sensor is shown.

DETAILED DESCRIPTION

Figure 1:
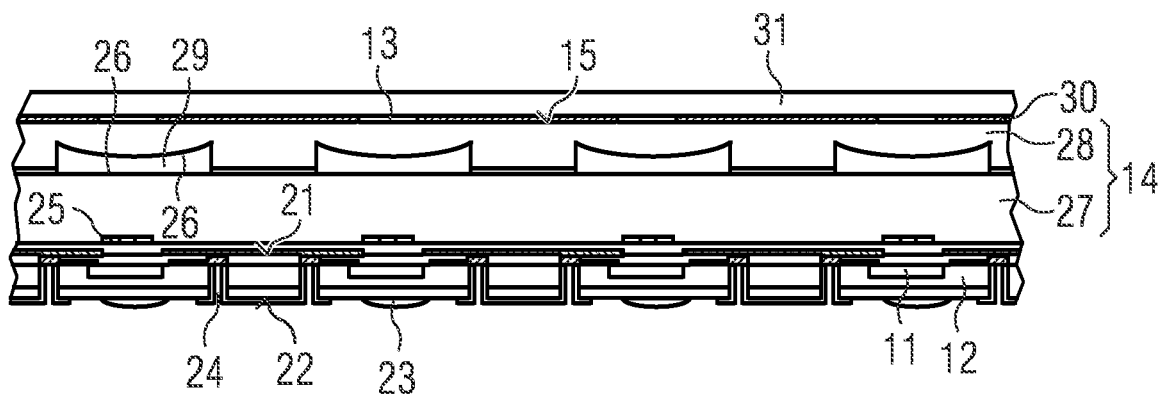
In FIG. 1, a cut-away view of an exemplary embodiment of a carrier with optical sensors and a cover material is shown.

In FIG. 1, a cut-away view of a carrier 12 is shown with optical sensors 11 and a cover material 14. With this figure a step of an exemplary embodiment of the method for manufacturing optical sensor arrangements 10 is shown. The carrier 12 can comprise silicon or glass. The optical sensors 11 are arranged on a top carrier surface 21 facing away from a bottom carrier surface 22 where electrical contacts 23 are arranged. The electrical contacts 23 can comprise a solder bump. The electrical contacts 23 are electrically connected with the optical sensors 11 via through silicon vias 24. The through silicon vias 24 extend through the carrier 12 towards the optical sensors 11. The carrier 12 comprises two through silicon vias 24 per optical sensor 11. A second solder bump, which can be connected with one of the two through silicon vias 24 per optical sensor 11, can be arranged behind the depicted electrical contact 23 such that it is not visible in the cut-away view in FIG. 1.

The optical sensor 11 can be, for example, a charge coupled device, a complementary metal oxide semiconductor device, a photo diode, an ultraviolet sensor or a pyro-electrical sensor. Above the optical sensors 11 an optical filter 25 is arranged. On the side of the optical sensors 11, facing away from the bottom carrier surface 22, a cover material 14 is arranged. The cover material 14 can comprise glass and it is transparent for the electromagnetic radiation, which is to be detected by the optical sensors 11. The cover material 14 comprises a lens 26 above each of the optical sensors 11. Above in this case means that the lens 26 is arranged on the side of the optical sensors 11 facing away from the bottom carrier surface 22.

Above the optical sensors 11, a first part 27 of the cover material 14 is arranged. A second part 28 of the cover material 14 comprises recesses 29. The second part 28 of the cover material 14 is glued to the first part 27 of the cover material 14 such that the recesses 29 are arranged between the two parts 27, 28 of the cover material 14. With this, two interfaces are formed around the recesses 29 which form optical lenses 26. On a top side 15 of the cover material 14, apertures 13 are formed for each optical sensor 11. The apertures 13 are arranged above the optical sensors 11 such that light which is incident perpendicular to the main plane of extension of the carrier 12 can be detected by the optical sensors 11. The apertures 13 are formed in an aperture layer 30 which is opaque, except for the apertures 13. The aperture layer 30 can comprise a metal and it is arranged on the top side 15 of the cover material 14. On top of the aperture layer 30, a cover layer 31 is arranged. The cover layer 31 is also transparent for light and electromagnetic radiation which is to be detected by the optical sensors 11.

Figure 2:
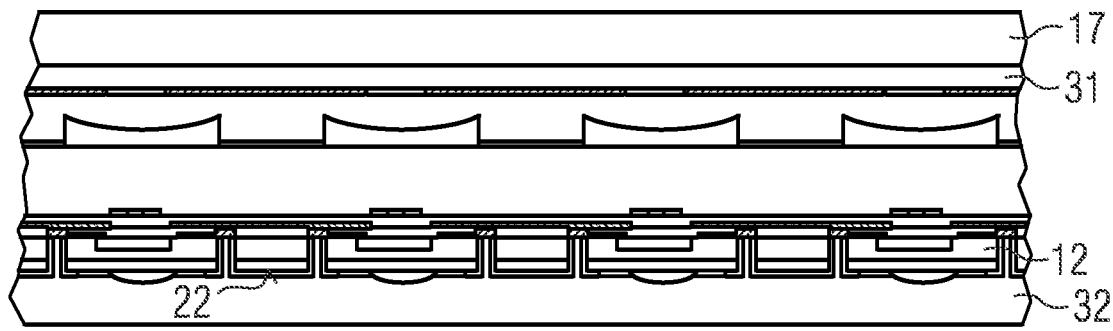

In FIG. 2, a next step of the method for manufacturing optical sensor arrangements 10 is shown. A tape 17 is applied to the cover layer 31. On the bottom carrier surface 22, a first protecting film 32 is applied. With this, the whole bottom carrier surface 22 is covered by the first protecting film 32 and the whole cover layer 31 is covered with the tape 17. The first protecting film 32 can be connected to a frame, which is not shown, such that it is stabilized by the frame and that also the optical sensor arrangements 10 are stabilized by the frame.

Figure 3:
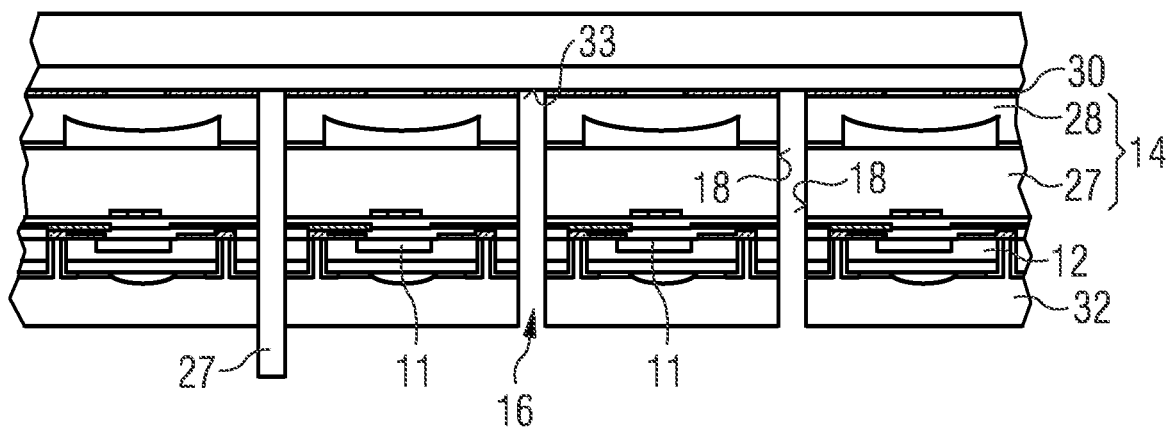

In the next step of the method for manufacturing optical sensor arrangements 10, as shown in FIG. 3, trenches 16 are formed between the optical sensors 11. This means all layers and materials are cut from the first protecting film 32 towards the aperture layer 30. This means the trenches 16 are formed by cutting the first protecting film 32, the carrier 12 and the cover material 14. The trenches 16 are arranged between the optical sensors 11. The trenches 16 can be formed by a sawing process. A saw 37 is shown in the left trench 16. The trenches 16 comprise inner walls 18 and a bottom surface 33.

Figure 4:
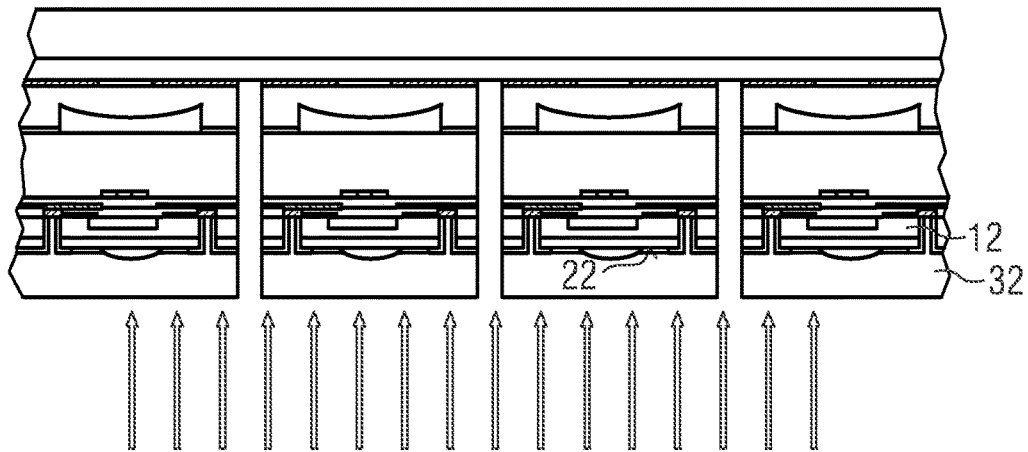

In FIG. 4, the next step of the method for manufacturing optical sensor arrangements 10 is shown. In this step, the bottom carrier surface 22 with the first protecting film 32 is exposed to ultraviolet light. With this, the adhesion force of the first protecting film 32 is reduced, which makes it easier to remove the first protecting film 32 in a next step of the method.

Figure 5:
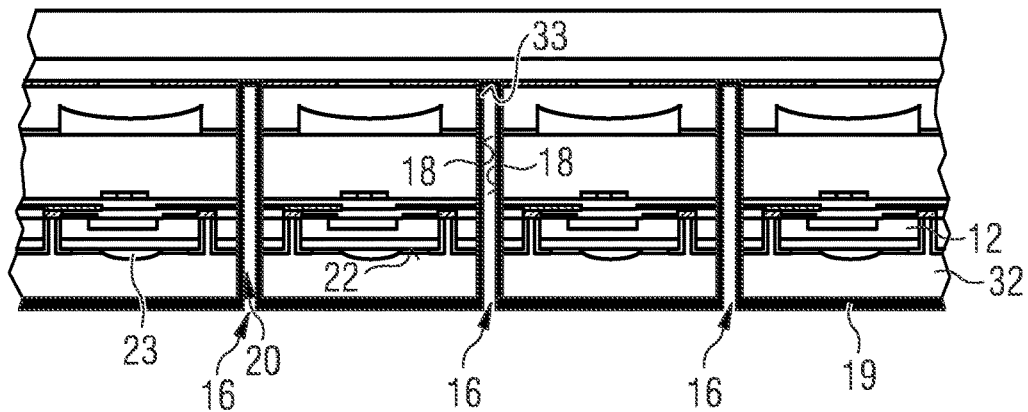

As shown in FIG. 5 in a next step of the method for manufacturing optical sensor arrangements 10, an opaque material 19 is deposited on the first protecting film 32 and within the trenches 16. The opaque material 19 can be deposited by physical vapor deposition or spray coating. Since the first protecting film 32 is applied to the bottom carrier surface 22, the electrical contacts 23 are protected from the opaque material 19. The inner walls 18 and the bottom surface 33 of the trenches 16 are covered with the opaque material 19. The opaque material 19 can be black and non-transparent. Furthermore, it can show a good adhesion to glass and silicon. The trenches 16 are not completely filled with the opaque material 19 such that inner volumes 20 are free of the opaque material 19.

Figure 6:
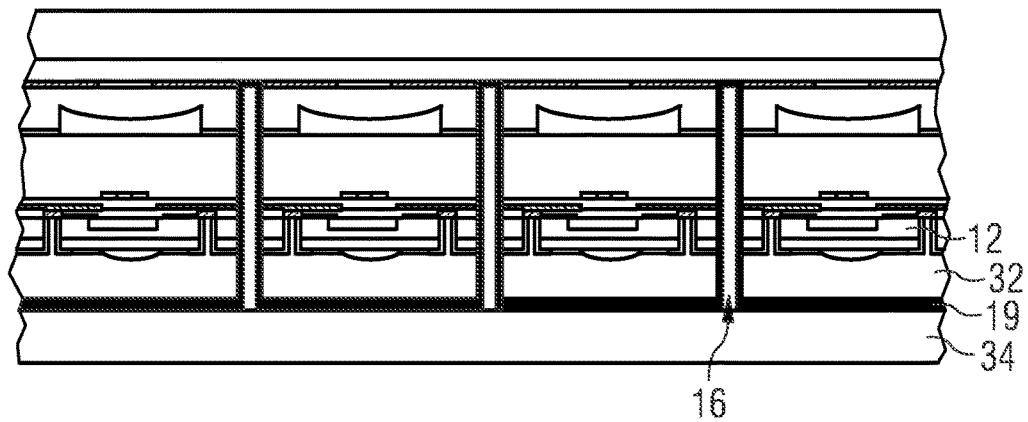

In a next step of the method for manufacturing optical sensor arrangements 10, as shown in FIG. 6, a second protecting film 34 is applied to the first protecting film 32 with the opaque material 19. This means the second protecting film 34 extends over the whole bottom carrier surface 22 and also over the trenches 16. The second protecting film 34 can be glued to the opaque material 19 on the first protecting film 32. Therefore, it is necessary that the second protecting film 34 has a high adhesion to the opaque material 19.

Figure 7:
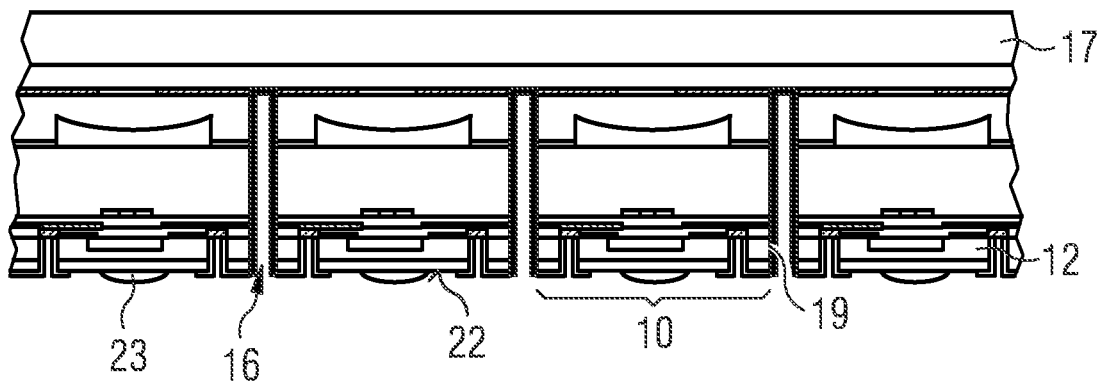

In FIG. 7, a next step of the method for manufacturing optical sensor arrangements 10 is shown. The two protecting films 32, 34 with the opaque material 19 are peeled off the bottom carrier surface 22. Therefore, the bottom carrier surface 22 is free of the opaque material 19 and also the electrical contacts 23 are free of the opaque material 19. The trenches 16 are still coated with the opaque material 19. At this stage, the optical sensor arrangements 10 are fully functional and they can be tested. However, they are still on the wafer level since they are arranged on the tape 17, which is stabilized by a frame. By testing the optical sensor arrangements 10 already on wafer level, the production costs can be reduced.

Figure 8:
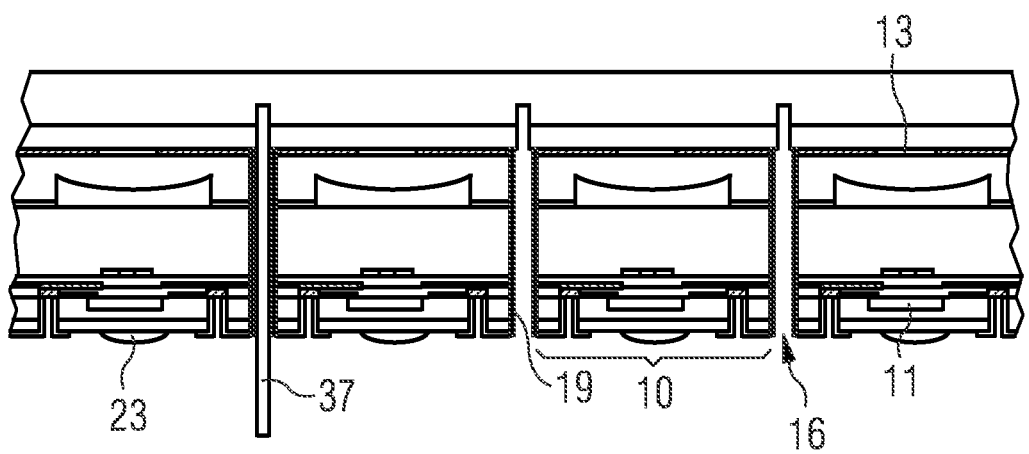

In a next step of the method for manufacturing optical sensor arrangements 10, as shown in FIG. 8, the optical sensor arrangements 10 are fully singulated by cutting. A saw 37 is shown in the left trench 16. This means, with the method for manufacturing optical sensor arrangements 10 it is possible to manufacture a housing 36 for an optical sensor 11 with a coating 35 such that light can only enter the housing 36 through the aperture 13.

In FIG. 9 a housing 36 for an optical sensor 11 is shown. On a carrier 12 an optical sensor 11 which is not shown is arranged. The housing 36 comprises two electrical contacts 23 at a bottom housing surface 39. On the side of the carrier 12 facing away from the bottom housing surface 39 a first part 27 and a second part 28 of a cover material 14 are arranged. The second part 28 of the cover material 14 comprises a recess 29. The second part 28 of the cover material 14 is glued to the first part 27 of the cover material 14 such that the recess 29 is arranged between the two parts 27, 28 of the cover material 14. With this, two interfaces are formed around the recess 29 which form an optical lens 26. An aperture 13 is formed above the optical lens 26. On top of the aperture 13, a cover layer 31 is arranged. The cover layer 31 is transparent for light and electromagnetic radiation which is to be detected by the optical sensor 11.

An opaque coating 35 is formed at side surfaces 40 of the housing 36 where the side surfaces 40 comprise all surfaces of the housing 36 except for the top housing surface 38 with the aperture 13 and the bottom housing surface 39. Furthermore, the coating 35 is very thin, for example less than 100 μm, and it is topographically flat since the trenches 16 were formed before the deposition of the opaque material 19. The electrical contacts 23 are free of the opaque material 19.

In FIG. 10 a bottom view of the housing 36 is shown. The housing 36 comprises four electrical contacts 23 and the coating 35. On the side of the housing 36 facing away from the bottom housing surface 39 the cover layer 31 is arranged.

The invention claimed is:

1. A method for manufacturing optical sensor arrangements, the method comprising:
    providing at least two optical sensors on a carrier, wherein each optical sensor of the at least two optical sensors comprise at least one electrical contact,
    providing a cover material on a side of the optical sensors facing away from the carrier,
    providing an aperture for each optical sensor by an opaque aperture layer on a top side of the cover material facing away from the carrier,
    providing a transparent cover layer on a top side of the opaque aperture layer facing away from the carrier,
    forming at least one trench between the optical sensors by cutting the carrier and the cover material from a side of the carrier towards the top side of the cover material leaving at least the transparent cover layer uncut,
    coating inner walls of the at least one trench with an opaque material, such that an inner volume of the at least one trench is free of the opaque material, and
    singulating of the optical sensor arrangements along the at least one trench,
    wherein the at least one electrical contact is protected by a first protecting film during the coating of the at least one trench.

2. The method for manufacturing optical sensor arrangements according to claim 1, wherein the at least one trench is formed by cutting the carrier and the cover material from the side of the carrier towards the top side of the cover material.

3. The method for manufacturing optical sensor arrangements according to claim 1, wherein the at least one electrical contact are arranged at a bottom side of the carrier facing away from the aperture.

4. The method for manufacturing optical sensor arrangements according to claim 1, wherein the first protecting film is removed after the coating of the at least one trench.

5. The method for manufacturing optical sensor arrangements according to claim 1, wherein the coating of the at least one trench with the opaque material comprises spray-coating or physical vapor deposition.

6. The method for manufacturing optical sensor arrangements according to claim 1, wherein the at least one trench comprises a bottom surface which is coated with the opaque material.

7. The method for manufacturing optical sensor arrangements according to claim 1, wherein a thickness of the opaque material at the inner walls of the at least one trench amounts to less than 100 μm.

8. The method for manufacturing optical sensor arrangements according to claim 1, wherein a lens is arranged between each optical sensor and a corresponding aperture.

* * * * *